United States Patent [19]
Duesman

[11] Patent Number: 5,956,275
[45] Date of Patent: Sep. 21, 1999

[54] MEMORY-CELL ARRAY AND A METHOD FOR REPAIRING THE SAME

[75] Inventor: Kevin G. Duesman, Boise, Id.

[73] Assignee: Micron Technology, Inc., Boise, Id.

[21] Appl. No.: 09/094,439

[22] Filed: Jun. 9, 1998

Related U.S. Application Data

[63] Continuation of application No. 08/835,867, Apr. 8, 1997, Pat. No. 5,787,044, which is a continuation of application No. 08/546,674, Oct. 23, 1995, abandoned.

[51] Int. Cl.$^6$ ............................................... G11C 7/00
[52] U.S. Cl. ...................... 365/200; 365/189.09; 365/195
[58] Field of Search .................................... 365/149, 200, 365/189.09, 195

[56] References Cited

U.S. PATENT DOCUMENTS

| | | | |
|---|---|---|---|
| 5,079,743 | 1/1992 | Suwa et al. | 365/149 |
| 5,079,746 | 1/1992 | Sato | 365/225.7 |
| 5,235,550 | 8/1993 | Zagar | 365/226 |
| 5,301,143 | 4/1994 | Ohri et al. | 365/96 |
| 5,373,463 | 12/1994 | Jones, Jr. | 365/145 |
| 5,450,360 | 9/1995 | Sato | 365/200 |
| 5,469,391 | 11/1995 | Haraguchi | 365/200 |
| 5,615,144 | 3/1997 | Kimura et al. | 365/145 |

*Primary Examiner*—Vu A. Le
*Attorney, Agent, or Firm*—Seed and Berry LLP

[57] ABSTRACT

An array of memory cells are arranged in rows and columns. The array includes a plurality of cell plates that are each coupled to at least one of the memory cells. A generator produces a bias voltage. A plurality of isolation circuits are each coupled between the generator and one or more of the cell plates. Each isolation circuit provides the bias voltage to the cell plate or plates to which the isolation circuit is coupled. The cell plates may be coupled to memory cells from a plurality of the columns. Additionally, each of the isolation circuits may selectively provide, in response to a control signal, the bias voltage to the cell plate or plates to which the isolation circuit is coupled.

15 Claims, 4 Drawing Sheets

MEMORY-CELL ARRAY AND A METHOD FOR REPAIRING THE SAME

CROSS-REFERENCE TO RELATED APPLICATIONS

This application is a continuation of application Ser. No. 08/835,867, filed Apr. 8, 1997, U.S. Pat. No. 5,787,044, which is a continuation of application Ser. No. 08/546,674, filed Oct. 23, 1995, now abandoned.

TECHNICAL FIELD

The present invention relates generally to electronic devices, and more specifically to memory-cell arrays having a structure that reduces the risk of an irreparable defect in the array and a method for repairing defective ones of such arrays.

BACKGROUND OF THE INVENTION

As memory devices, such as dynamic random access memories (DRAM), increase in density, it becomes statistically more likely that one or more short circuits will exist, such as between a cell plate and a word, i.e., row, line, a bit, i.e., column, line, or another portion of a memory device. For example, for a 4-megabit DRAM, the probability of having at least one such short circuit ranges between approximately 10%–20%, depending upon the particular manufacturing process used. Causes of such short circuits include particle contamination and process variability. Even memory devices manufactured in the cleanest fabrication facilities and by the most carefully controlled processes are not immune from such yield-reducing short circuits.

FIG. 1 is a schematic block diagram of a memory-cell array 10 of a memory device 12. The array 10 includes a number of substantially identical memory cells 13, which each include an access switch 14 and a storage device 16. As shown here, the access switch is a transistor 14, and the storage device is a capacitor 16. The memory cells 13 are arranged in rows 0–x and columns 0–n; one memory cell 13 is positioned at the intersection of each row and column. As shown, each row includes one row line ROW, and each column includes a pair of complementary column lines COL and $\overline{COL}$. Thus, each memory cell 13 has a control terminal coupled to an associated row line and a data terminal coupled to an associated column line. Each pair of complementary column lines is coupled to a sense amplifier 18, which reads the data stored in an addressed memory cell 13 that is coupled to either of the pair of complementary column lines. The array 10 also includes equilibrate switches 20, each of which is coupled between a different pair of complementary column lines and has a control terminal coupled to an equilibrate line EQ. As shown here, the equilibrate switches are the transistors 20.

Additionally, the memory-cell array 10 includes a cell plate CP, which is typically a plane formed in a conductive layer of the memory device 12 in the vicinity of the array 10 as indicated by the dashed outline. Each memory cell 13 has a reference terminal that is coupled to the cell plate CP. More specifically, as shown, each capacitor 16 has a first plate 22, which is coupled to the associated access transistor 14, and a second plate 24, which is coupled to the cell plate CP. A voltage generator 26 generates from a supply voltage Vcc a reference or bias voltage, which is typically equal or approximately equal to Vcc/2. Typically, Vcc is approximately 5 volts, although in newer memory devices Vcc may be as low as 3.3 volts. The voltage generator 26 drives the cell plate CP with this bias voltage, which, as discussed below, reduces the stresses to which the capacitors 16 are subjected.

Each of the memory cells 13 stores a single bit of data. A voltage of approximately Vcc at the plate 22 indicates a positive voltage (i.e., the plate 22 is more positive than the plate 24) of Vcc/2 across the capacitor 16. This positive voltage corresponds to a first binary data value, typically a 1. Conversely, a voltage of approximately 0 at the plate 22 indicates a negative voltage of −Vcc/2 across the capacitor 16. This negative voltage corresponds to a second binary data value, typically a 0. Thus, a capacitor 16 of a memory cell 13 never has more than |Vcc/2| across it. The reduction in the voltage stresses (as compared with capacitors of prior memory devices that could have voltages of Vcc across them) that are applied to the capacitors 16 greatly increases their operational lifetime.

In operation of the memory device 12, before the cells 13 are read from or written to, control circuitry (not shown in FIG. 1) generates an equilibration signal on the line EQ to equilibrate via the transistors 20 each of the complementary pairs of column lines COL and $\overline{COL}$. That is, the transistor 20 is closed to couple together COL and $\overline{COL}$ of each pair of column lines and to bring COL and $\overline{COL}$ to the same voltage level of approximately Vcc/2. (Typically, before the equilibration interval, one of the lines COL and $\overline{COL}$ of each pair is at a logic 0 or 0 volts, and the other is at a logic 1 or Vcc. By shorting the two lines together, the voltage on the first line rises from 0 to Vcc/2, and the voltage on the second line falls from Vcc to Vcc/2.) During the equilibration interval, the control circuitry drives the row lines $ROW_0$–$ROW_x$ with a voltage substantially equal to 0 volts to deactivate the memory cells 13.

After the equilibration interval, during a read cycle, the control circuitry drives the row line of the addressed memory cell 13 with a voltage approximately equal to Vcc to activate the addressed cell 13. The voltage on the plate 22 of the capacitor 16 is transferred via the transistor 14 to the complementary column line coupled to the addressed cell 13. The associated sense amplifier 18 compares this voltage level to the Vcc/2 on the other complimentary column line, drives the higher column line to Vcc and the lower column line to 0, and provides the data contents of the addressed cell 13 to read/write circuitry (not shown in FIG. 1).

After the equilibration interval, during a write cycle, the control circuitry drives the row line that is coupled to the addressed cell 13 with Vcc, and the read/write circuit drives the column line that is coupled to the addressed cell 13 with a voltage, either Vcc or 0, that corresponds to the value of the data bit to be stored in the addressed cell 13.

A problem may arise when either a row line, a column line, or another line becomes short-circuited to the cell plate CP. For example, if the line to which the cell plate CP is shorted is driven to 0 volts, the cell plate CP will gradually discharge to a voltage lower than Vcc/2. This discharging typically occurs because the voltage generator 20 cannot output enough current to compensate for the current lost via the short circuit. Likewise, if the line to which the cell plate CP is shorted is driven to Vcc, the cell plate CP will gradually charge to a voltage greater than Vcc/2. Either scenario may cause data storage errors, and worse, may generate voltages larger than Vcc/2 across, and thus may destroy, one or more of the capacitors 16. Because there is often no way to repair such a short circuit, the memory device 12 is often irreparably damaged, and must be discarded.

FIG. 2 is a cross-section of the array 10 of FIG. 1 that illustrates in more detail how a short circuit between the cell plate CP and a column line or a row line may occur. As shown, the array 10 includes a column line 24 that is electrically isolated from the cell plate CP by an insulating layer 26. A memory cell 13 includes a transistor 14 that has its source S coupled to the plate 28 of the capacitor 16. The other plate 24 is formed by the cell plate CP. Thus, the cell plate CP in effect forms a common plate for all the capacitors 16. An insulating layer 30 isolates the cell plate CP from the memory cell 13. A conductive via 32, which extends through the cell plate CP and the layers 26 and 30, couples the column line 24 to the drain D of the transistor 14. An insulating layer 34 surrounds the via 32, and thus isolates the via 32 from the cell plate CP. A row line 36, which is coupled to the memory cell 13, also acts as the gate G of the transistor 14.

As shown, if the insulator 34 is defective in the vicinity of the cell plate CP, the via 32 may contact the cell plate CP and thus cause a short circuit between the column line 24 and the cell plate CP. Furthermore, although not shown, a defect in the insulating layer 30 may cause a short circuit between the row line 36 and the cell plate CP. As stated above, even just one such short circuit may render the memory device 12 irreparably damaged.

SUMMARY OF THE INVENTION

In accordance with an aspect of the present invention, an array of memory cells are arranged in rows and columns. The array includes a plurality of cell plates that are each coupled to at least one of the memory cells. A generator produces a bias voltage. A plurality of isolation circuits are each coupled between the generator and at least one of the cell plates. Each isolation circuit provides the bias voltage to the cell plate or plates to which the isolation circuit is coupled. In a related aspect of the invention, each of the cell plates is coupled to memory cells from a plurality of the columns. In another related aspect of the invention, each of the isolation circuits selectively provides, in response to a control signal, the bias voltage to the cell plate or plates to which the isolation circuit is coupled.

An advantage provided by one aspect of the present invention is a structure and method for repairing a memory-cell array in which a portion of the cell plate is short circuited or otherwise defective.

DETAILED DESCRIPTION OF THE INVENTION

Figure 3:
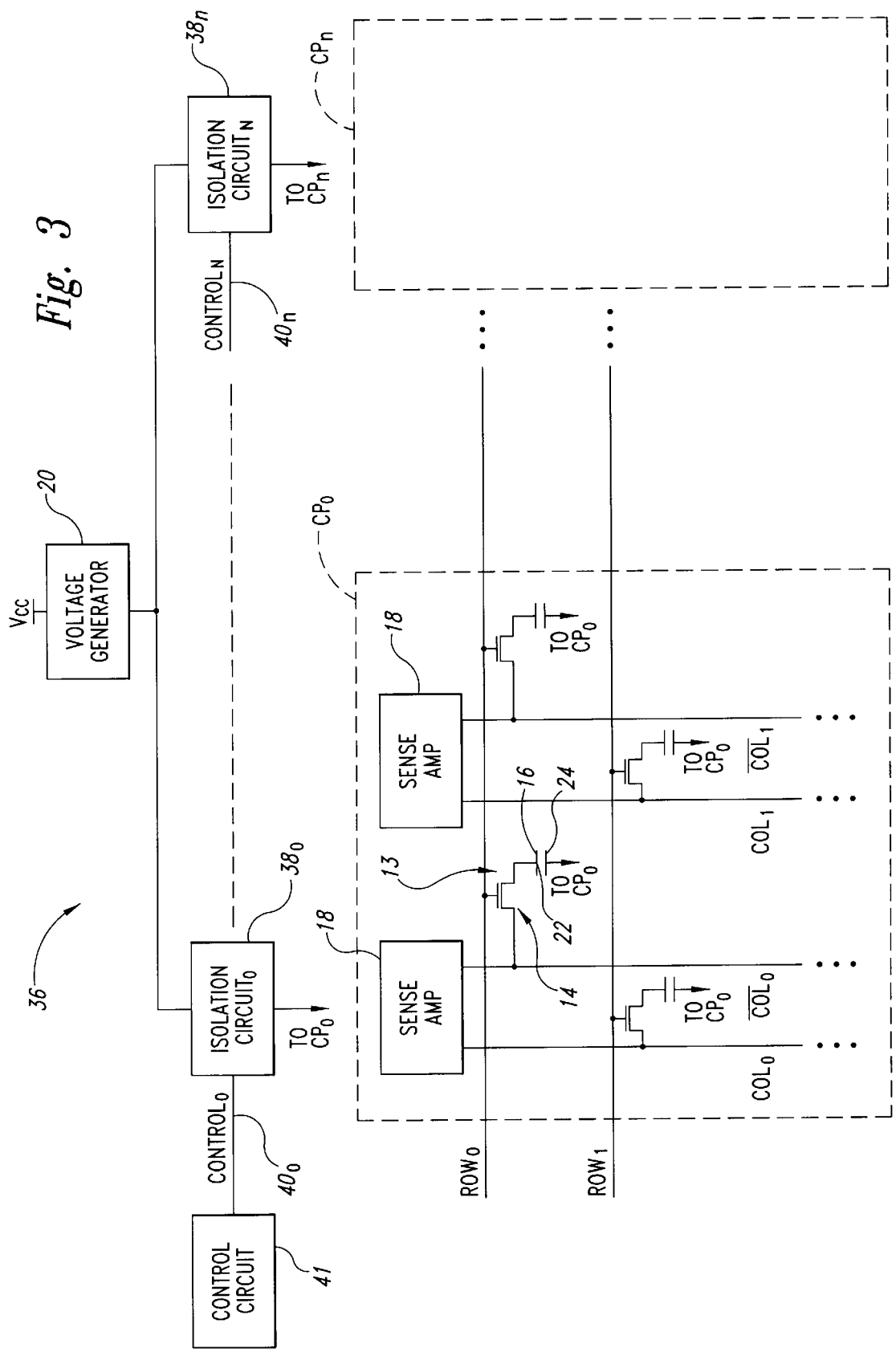
FIG. 3 is a schematic diagram of a memory-cell array in accordance with the present invention.

FIG. 3 is a schematic diagram of a memory-cell array 36 in accordance with the present invention. In many aspects, the array 36 is similar to the array 10 of FIG. 1. For example, the array 36 includes a number of memory cells 13, which are arranged in a plurality of rows and columns as shown. Each of the memory cells 13 includes an access transistor 14 and a storage capacitor 16, which are coupled as shown. A number of sense amplifiers 18 are each coupled to a complementary pair of column lines COL and $\overline{COL}$. A voltage generator 20, which is coupled to the supply voltage Vcc, generates a bias voltage, which in one aspect of the invention is Vcc/2. The array 36 also includes an equilibration line EQ and a number of equilibration transistors 20, which are omitted from FIG. 3 for clarity.

Figure 1:
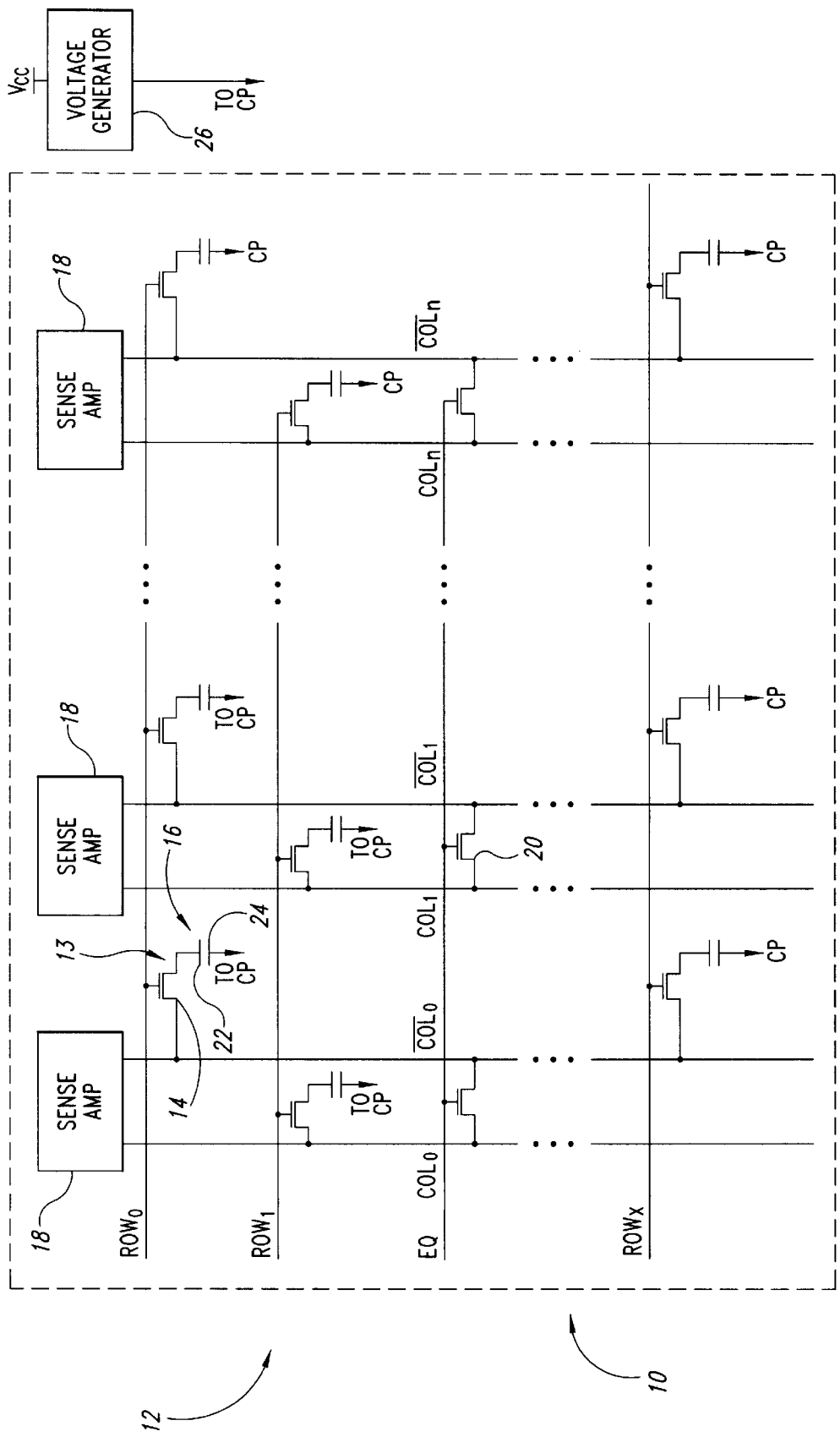
FIG. 1 is a schematic diagram of a memory-cell array of a conventional memory device.
Figure 2:
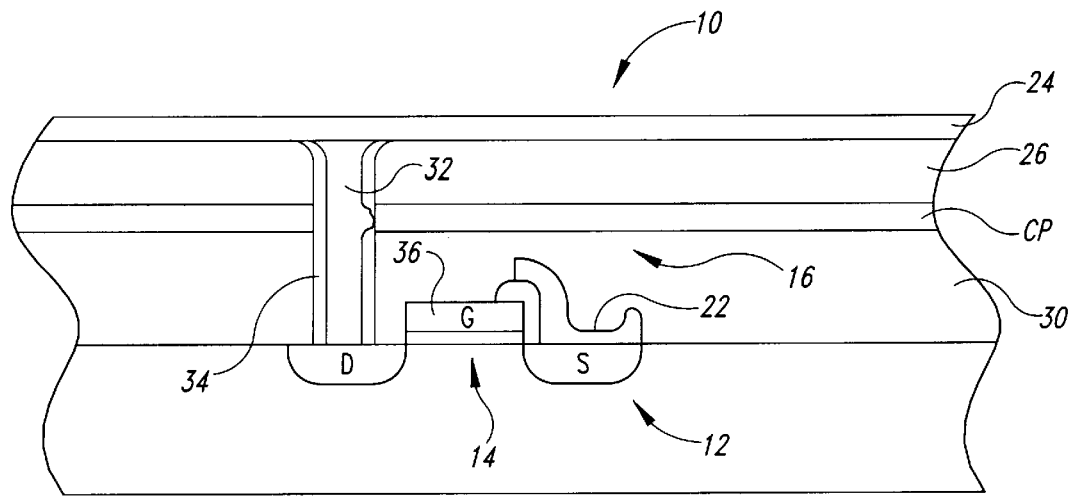
FIG. 2 a cross sectional view of a portion of the memory-cell array of FIG. 1.

Unlike the array 10 of FIG. 1, however, the array 36 includes a plurality of cell plates $CP_0$–$CP_n$, which are each associated with one or more complimentary pairs of column lines. That is, the storage capacitors 16 of the memory cells 13 that are coupled to the associated column lines are all coupled to the same cell plate CP. For example, as shown, the storage capacitors 16 associated with the column lines COL0, $\overline{COL0}$, COL1, and COL1 are all coupled to the cell plate $CP_0$. A group of columns that are associated with a particular cell plate CP may also be associated with a group of the same number of redundant columns (not shown in FIG. 3). Although each cell plate CP is shown associated with two complementary pairs of column lines, each cell plate may be associated with fewer or more complementary pairs of column lines.

Each of the individual cell plates $CP_0$–$CP_n$, is coupled to the voltage generator 20 via a respective one of the isolation circuits $38_0$–$38_n$. In one aspect of the invention as shown, each isolation circuit 38 has a control terminal that is coupled to a respective control line $40_0$–$40_n$. The control circuitry (not shown in FIG. 3) generates signals $CONTROL_0$–$CONTROL_n$ on the control lines $40_0$–$40_n$ to control the operation of the isolations circuits 38.

In one aspect of the invention, the cell plates $CP_0$–$Cp_n$ are formed from a single conductive layer as in prior memory devices. However, unlike prior memory devices, isolation trenches (not shown) are conventionally etched to divide the single conductive layer into the plurality of cell plates $CP_0$–$Cp_n$. The isolation trenches are then filled with an insulator material in a conventional manner. Or, the cell plates $CP_0$–$Cp_n$ can be formed in different conductive layers.

In operation, if a short circuit develops between one of the cell plates CP and any other portion of the memory-cell array 36, the isolation circuit 38 associated with the shorted cell plate CP prevents the short circuit from affecting the bias voltage that the voltage generator 20 provides to the other cell plates CP. That is, the isolation circuit 38 prevents the short circuit from pulling up or down the bias voltage on the other non-shorted cell plates CP. By effectively removing from the array 36 the shorted cell plate CP, the array 36, and thus the memory device 42 (not shown in FIG. 4) that contains the array 36, are not rendered irreparably defective. As discussed below in conjunction with FIG. 5, the memory cells 13 associated with the shorted cell plate CP can be replaced with redundant memory cells.

Figure 4A:
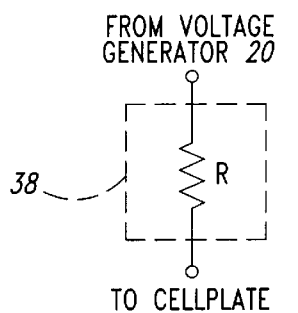
FIGS. 4A and 4B are schematic diagrams of different embodiments of the isolation circuits of FIG. 3.

FIG. 4A illustrates one embodiment of an isolation circuit 38 of FIG. 3. The isolation element 38 includes an impedance, here a resistor R, that has a value sufficient to limit the current drawn through a short-circuited cell plate CP to an amount that will not alter the bias voltage output by the voltage generator 20 (FIG. 3). As shown, if the isolation elements 38 comprise such two-terminal impedances, the control lines $40_0$–$40_n$ (FIG. 3) are unnecessary and may be omitted.

Figure 4B:
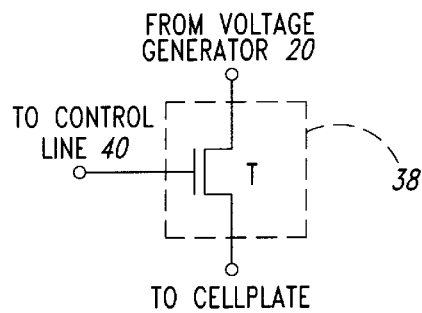

FIG. 4B illustrates another embodiment of an isolation circuit 38 of FIG. 3. The isolation circuit 38 includes a switch, here a field-effect transistor T. The control terminal of the switch, here the gate of the transistor T, is coupled to a respective control line 40 (FIG. 3). If an associated cell plate CP is not short circuited or otherwise defective, the control circuitry (not shown in FIG. 4B), via a corresponding signal CONTROL on the respective control line 40, holds the switch in a closed or conducting state. If the associated cell plate CP is defective, however, the control circuitry holds the switch in an open or nonconducting state to decouple the defective cell plate CP from the voltage generator 20 (FIG. 3).

Although two possible embodiments of the isolation circuits 38 are discussed, it is understood that other circuit elements or circuits may be used for the isolation circuits 38.

Figure 5:
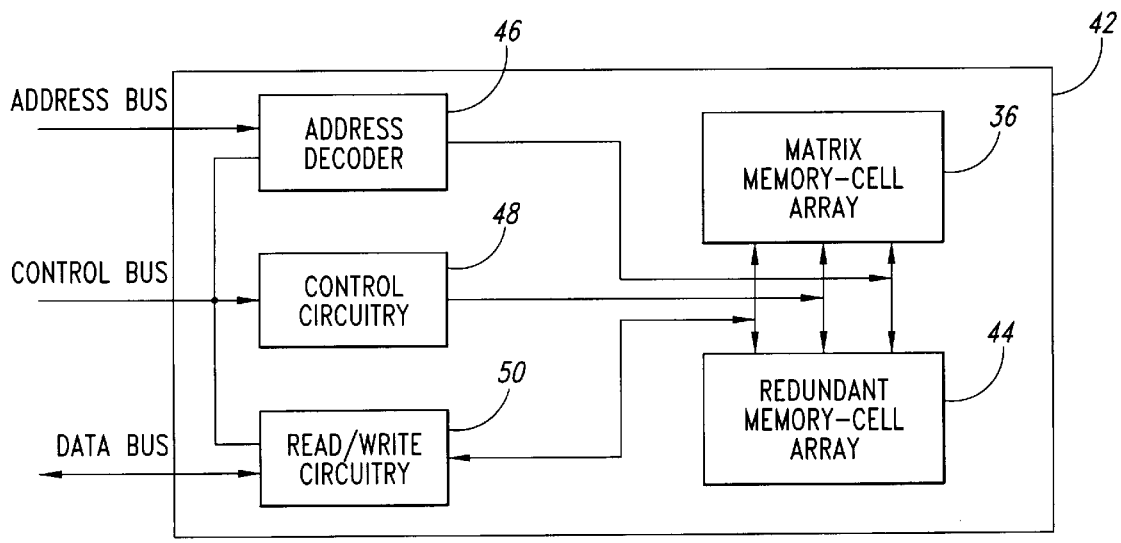
FIG. 5 is a block diagram of a memory device that includes the memory-cell array of FIG. 3.

FIG. 5 is a block diagram of a memory device 42 that includes the memory-cell array 36 of FIG. 3. As shown, the memory device 42 also includes an array 44 of redundant memory cells, an address decoder 46, control circuitry 48, and read/write circuitry 50. As shown, the arrays 36 and 44 are coupled to the address decoder 46, the control circuitry 48, and the read/write circuitry 50. The address decoder 46 is also coupled to an ADDRESS bus and a CONTROL bus. The control circuitry 48 is coupled to the CONTROL bus, and the read/write circuitry 50 is coupled to the CONTROL bus and a DATA bus.

In operation, external circuitry (not shown) provides an address on the ADDRESS bus and control signals on the CONTROL bus during both read and write cycles. During a read cycle, the address is provided to the memory cell array 36 by the address decoder 46, and the control circuitry 48 provides the appropriate control signals such that the array 36 provides to the read/write circuitry 50 data from the addressed memory cell or cells 13 (FIG. 3). The read/write circuitry 50 then places this data onto the DATA bus. During a write cycle, the address decoder 46 and the control circuitry 48 respectively provide the address and control signals to the array 36. The external circuitry also provides the data to be written into the array 36 to the read/write circuitry 50, which provides this data to the array 36. The array 36 then stores this data in the addressed memory cell or cells 13.

In a situation where one or more groups of memory-cell columns of the array 36 are found defective (because of a short-circuited cell plate CP or otherwise), these columns are effectively replaced with substantially identical groups of columns from the redundant array 44. This replacement is typically done in a conventional manner during testing of the memory device 42, by programming the control circuitry 48 to map the selected columns from the redundant array 44 to the addresses of the defective columns in the array 36. Thus, when the external circuitry addresses a memory cell 13 in a defective column, the data is routed to a redundant memory cell in a corresponding replacement column located in the redundant array 44. Such rerouting, however, is transparent to the external circuitry.

Referring to FIG. 3, in one embodiment of the invention, if at least one of a predetermined group of columns is defective, the whole group is replaced with a corresponding group of redundant columns from the redundant array 44. Such a technique allows one to set the maximum number of cell plates CP equal to the number of the predetermined groups of columns in the array 36. Having more than this maximum number of cell plates CP, such that one or more groups of the columns in the array 36 are each associated with multiple cell plates CP, would provide no additional benefit. For example, because defective columns in the array 36 are replaced in groups anyway, if one of the multiple cell plates CP became shorted, all the columns in the group, even those not associated with the shorted cell plate CP, would have to be replaced.

Figure 6:
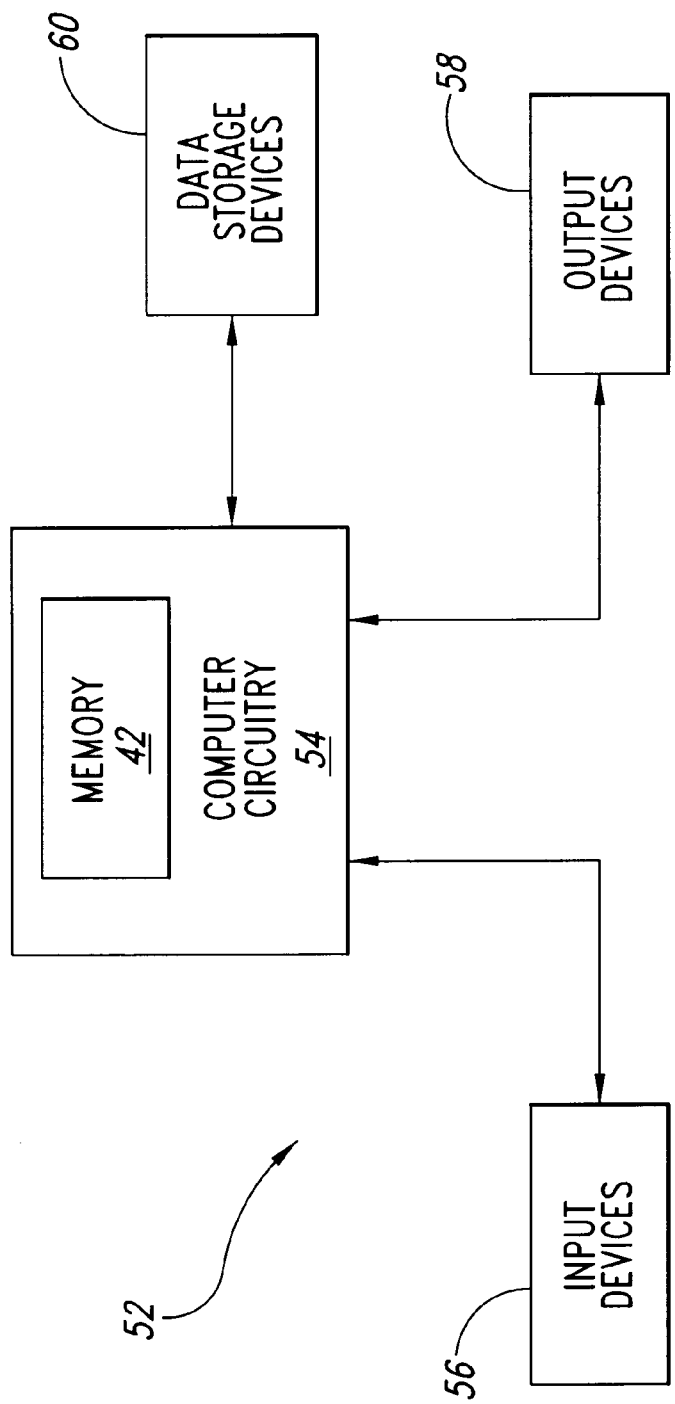
FIG. 6 is a block diagram of a computer system that includes the memory device of FIG. 5.

FIG. 6 is a block diagram of a computer system 52 that uses the memory device 42 of FIG. 5. The computer system 52 includes computer circuitry 54 for performing computer functions, such as executing software to perform desired calculations and tasks. The circuitry 54 typically includes a processor (not shown) and the memory 42 as shown. One or more input devices 56, such as a keypad or a mouse, are coupled to the computer circuitry 54 and allow an operator (not shown) to manually input data thereto. One or more output devices 58 are coupled to the computer circuitry 54 to provide to the operator data generated by the computer circuitry 54. Examples of output devices 58 include a printer and a video display unit. One or more data storage devices 60 are coupled to the computer circuitry 54 to store data on or retrieve data from external storage media (not shown). Examples of the storage devices 60 and corresponding storage media include drives that accept hard and floppy disks, tape cassettes, and compact disk read-only memories (CD-ROMs). Typically, the computer circuitry 54 generates the ADDRESS, $\overline{RAS}$, $\overline{CAS}$, $\overline{WE}$, and $\overline{OE}$ signals as well as other signals. The computer circuitry 54 is coupled to the ADDRESS, DATA, and CONTROL buses of the memory 42 as shown in FIG. 5.

It will be appreciated that, although specific embodiments of the invention have been described herein for purposes of illustration, various modifications may be made without departing from the spirit and scope of the invention. Accordingly, the invention is not limited except as by the appended claims.

I claim:

1. A method for replacing a defective cell plate of an array of memory cells having a plurality of cell plates, each cell plate coupled to at least one memory cell and coupled to a reference supply, the method comprising:

limiting the current drain of a cell plate that is coupled to a voltage source other than the reference voltage supply; and substituting an alternative cell plate for the cell plate coupled to the voltage source.

2. The method of claim 1 wherein limiting the current drain comprises uncoupling the cell plate from the reference voltage supply.

3. The method of claim 2 wherein uncoupling the cell plate comprises opening a switch.

4. The method of claim 1 wherein limiting the current drain comprises increasing a resistance coupled between the cell plate and the reference voltage supply.

5. A method for substituting an alternative storage location for a defective storage location of a memory array having a plurality of cell plates, each cell plate coupled to at least one storage location and coupled to a reference supply, the method comprising:

locating in the memory array a defective storage location;

isolating from the reference supply a one of the plurality of cell plates coupled to the defective storage location; and replacing the defective storage location with the alternative storage location and an alternative cell plate.

6. The method of claim 5 wherein locating a defective storage location comprises identifying a cell plate having a voltage unequal to the reference voltage.

7. The method of claim 5 wherein isolating comprises limiting the current drain on the cell plate having a voltage unequal to the reference voltage.

8. The method of claim 5 wherein isolating comprises uncoupling the cell plate having a voltage unequal to the reference voltage from the reference generator.

9. The method of claim 8 wherein uncoupling the cell plate comprises opening a switch.

10. A method of preventing in an array of memory cells having a plurality of cell plates, each cell plate coupled to at least one memory cell and coupled to a reference supply, a short circuited cell plate from affecting the voltage generated by the reference supply, the method comprising isolating the short-circuited cell plate from the reference supply.

11. The method of claim 10 wherein isolating the short-circuited cell plate comprises uncoupling the short circuited cell plate from the reference supply.

12. The method of claim 11 wherein uncoupling comprises opening a switch coupled between the short-circuited cell plate and the reference supply.

13. The method of claim 10 wherein isolating the short-circuited cell plate comprises limiting the current flowing between the short-circuited cell plate and the reference supply.

14. The method of claim 13 wherein limiting the current flowing comprises increasing series resistance between the short-circuited cell plate and the reference supply.

15. The method of claim 10, further comprising substituting an alternative cell plate for the short-circuited cell plate.

* * * * *